US 6,651,868 B2

(12) United States Patent
Kawamura

(10) Patent No.: US 6,651,868 B2
(45) Date of Patent: Nov. 25, 2003

(54) WORKPIECE RETAINER FOR A BONDING APPARATUS

(75) Inventor: Takatoshi Kawamura, Akishima (JP)

(73) Assignee: Kabushiki Kaisha Shinkawa, Tokyo (JP)

( * ) Notice: Subject to any disclaimer, the term of this patent is extended or adjusted under 35 U.S.C. 154(b) by 0 days.

(21) Appl. No.: 10/050,386

(22) Filed: Jan. 16, 2002

(65) Prior Publication Data
US 2002/0096552 A1 Jul. 25, 2002

(30) Foreign Application Priority Data
Jan. 19, 2001 (JP) ........................................ 2001-011722

(51) Int. Cl.[7] ........................ B23K 37/04; B23K 37/00; B23Q 3/00
(52) U.S. Cl. .................... 228/49.5; 156/580; 269/289 R
(58) Field of Search .................... 228/49.5, 4.1–6.2, 228/7, 179.1–180.21, 180.5, 185, 212; 269/289 R, 315; 156/499, 580, 583.6, 581

(56) References Cited

U.S. PATENT DOCUMENTS 3,655,177 A * 4/1972 Coucoulas ..................... 269/1
5,060,052 A * 10/1991 Casto et al. ................. 257/723
5,154,339 A * 10/1992 Takeuchi et al. ........... 228/47.1
5,227,003 A * 7/1993 Takeuchi .................... 156/499
5,461,501 A * 10/1995 Sato et al. ..................... 349/42
5,793,100 A * 8/1998 Takahashi ................... 257/669
5,826,778 A * 10/1998 Sato et al. ................. 228/44.7
6,015,079 A * 1/2000 Fogal et al. ................. 228/4.1
6,054,337 A * 4/2000 Solberg ....................... 438/107
6,313,528 B1 * 11/2001 Solberg ....................... 257/723
6,318,622 B1 * 11/2001 Hollingsworth et al. ..... 228/4.5

FOREIGN PATENT DOCUMENTS

JP H06-21241 6/1994
JP 2002-237502 * 8/2002

* cited by examiner

Primary Examiner—M. Alexandra Elve
Assistant Examiner—Zidia Pittman
(74) Attorney, Agent, or Firm—Koda & Androlia

(57) ABSTRACT

A retaining device for holding at a place a workpiece such as a lead frame including a pair of first slits formed so as to surround the bonding window opened in the retainer. Furthermore, second slits are formed so as to extend to the outside from the end portions of the first slits, thus forming first connecting areas; and third slits are formed on the outside of the second slits so as to be perpendicular to the first connecting areas, thus forming second connecting areas.

2 Claims, 4 Drawing Sheets

WORKPIECE RETAINER FOR A BONDING APPARATUS

BACKGROUND OF THE INVENTION

1. Field of the Invention

The present invention relates to a workpiece retainer for a bonding apparatus.

2. Prior Art

Japanese Utility Model Application Publication (Kokoku) No. H06-21241 discloses one example of workpiece retainers used in a bonding apparatus. In this workpiece retainer, slits are formed so as to surround a bonding window, so that the retainer presses the numerous leads of a lead frame against a heating block.

The advantage of this workpiece retainer is that it can press the leads against the heating block in a uniform fashion. However, in this prior art retainer, slits are merely formed as a combination of substantially angled C-shaped slits that are arranged so as to face the bonding window. Accordingly, it has problems. Because of such a slit shape, the thermal expansion of the workpiece retaining portions of the workpiece retainer caused by the heating block is not well absorbed, and as a result the workpiece retaining portion which is a part of the workpiece retainer is deformed.

SUMMARY OF THE INVENTION

Accordingly, the object of the present invention is to provide a workpiece retaining device or a retainer used in a bonding apparatus that can effectively absorb the thermal expansion of the workpiece retaining portion of the workpiece retainer and that can securely retain the leads of a lead frame over the entire retention range.

The above object is accomplished by a unique structure for a workpiece retainer in which: a plurality of first slits are formed so as to surround bonding windows opened in the retainer; second slits are formed so as to respectively extend to the outside from the end portions of the first slits, thus forming first connecting areas; and third slits are further formed so as to extend perpendicular to the first connecting areas on the outside of the second slits, thus forming second connecting areas.

In this structure, the bonding windows are provided so as to correspond in number to the bonding portions of a lead frame that has a plurality of rows of bonding portions; and in addition, workpiece retaining portions are formed along the bonding windows so that the retaining portions are located on the undersurfaces of both sides of each bonding window.

DETAILED DESCRIPTION OF THE INVENTION

Figure 1A:
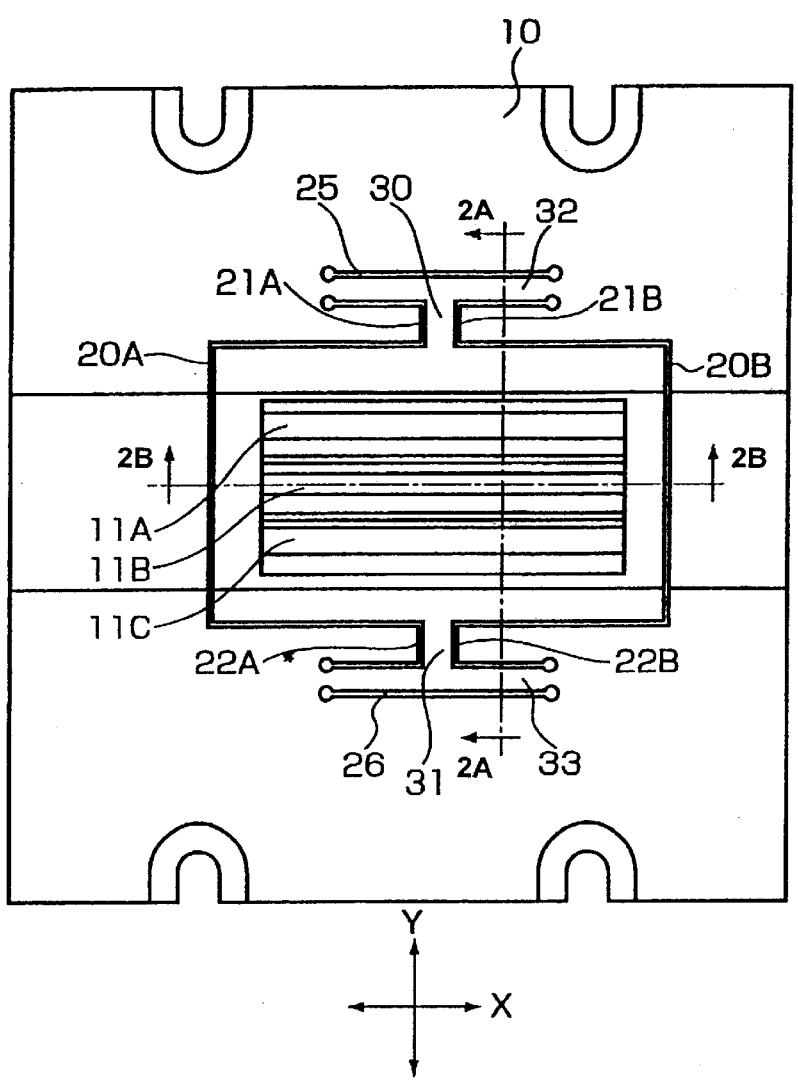
FIG. 1A is a top view of the workpiece retainer for a bonding apparatus according to one embodiment of the present invention, FIG. 1B being a right-side view thereof.
Figure 1B:
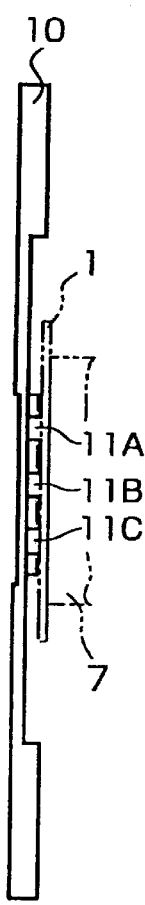
Figure 3:
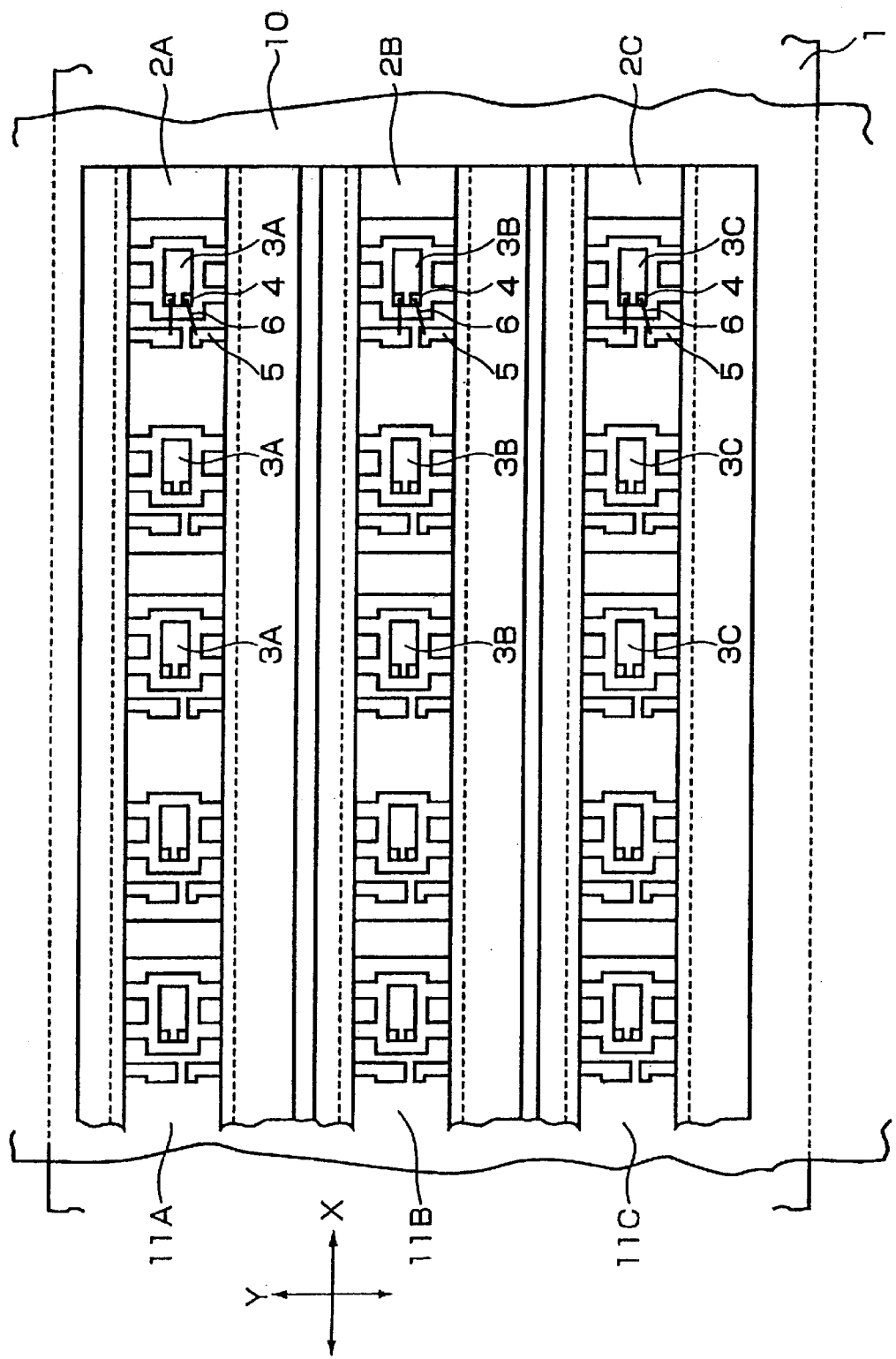
FIG. 3 is an enlarged top view of the essential portions in regards to the relationship between the workpiece and the workpiece retainer.

As seen from FIG. 3, a lead frame 1 shown by two-dot chain lines in FIG. 1B has bonding portions 2A, 2B and 2C in three rows in the conveying direction (hereafter referred to as the "direction of the X axis") of the lead frame 1. A plurality of semiconductor chips 3A, 3B and 3C are mounted in the bonding portions 2A, 2B and 2C.

The lead frame 1 is brought on a heating block 7 shown by another two-dot chain line in FIG. 1B, and pads 4 of the semiconductor chips 3A, 3B and 3C and the leads 5 of the lead frame 1 are connected with wires 6 as shown in FIG. 3 by a wire bonding apparatus (not shown). This bonding is performed with the lead frame 1 being pressed against the heating block 7 by a workpiece retainer 10.

Figure 2A:
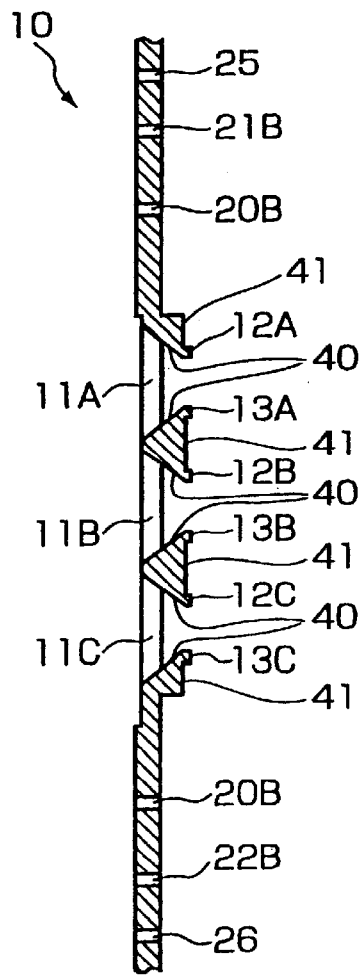
FIG. 2A is an enlarged sectional view taken along the line 2A—2A in FIG. 1A, FIG. 2B being an enlarged sectional view taken along the line 2B—2B in FIG. 1A.
Figure 2B:
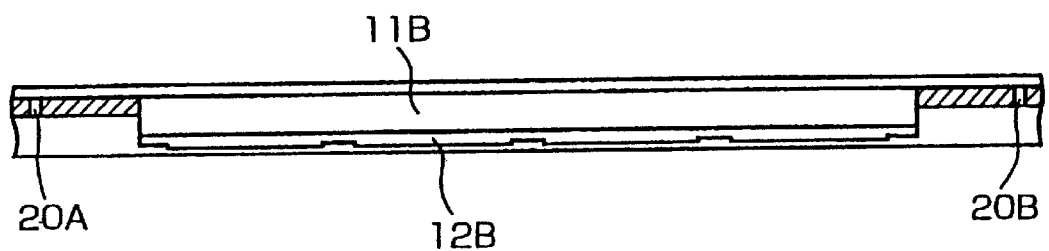

As seen from FIGS. 1 through 3, the workpiece retainer 10, that is made of, for instance, a metal, ceramics and the like, is provided with three bonding windows 11A, 11B and 11C so as to correspond to the three rows of semiconductor chips 3A, 3B and 3C mounted on the lead frame 1. The bonding windows 11A, 11B and 11C are in a rectangular shape with its longer sides in the lateral directions that extend in the direction of X axis, and such windows are formed inside two first slits 20A and 20B. As best seen from FIG. 2A, workpiece retaining portions 12A, 13A, 12B, 13B, 12C and 13C are formed along the bonding windows 11A, 11B and 11C of the workpiece retainer 10 so that the workpiece retaining portions are located on the undersurfaces on both sides of the bonding windows 11A, 11B and 11C.

As seen from FIG. 1A, two first slits 20A and 20B that have a certain width are formed as substantially angled C-shaped slits in the workpiece retainer 10 so as to face and surround the bonding windows 11A, 11B and 11C. Furthermore, second slits 21A, 22A and 21B, 22B formed as key-shaped (L-shaped) slits with a certain width are provided so as to extend from the end portions of the first slits 20A and 20B. In addition, third slits 25 and 26 that have a certain width and extend in the direction of the X-axis are formed outside the second slits 21A, 21B and 22A, 22B.

With the above arrangement of the slits, the inside and outside areas of the first slits 20A and 20B have a structure in which such areas are connected (or continuous) by first connecting areas 30 and 31 and second connecting areas 32 and 33. More specifically, the first connecting area 30 is located between the second slits 21A and 21B, and the other first connecting area 31 is located between the second slits 22A and 22B. Also, the second connecting area 32 is located between the second slits 21A and 21B and the third slit 25, and the other second connecting area 33 is located between the second slits 22A and 22B and the third slit 26.

In FIG. 2A, the reference numerals 40 are side surfaces on both sides of each window, and the reference numerals 41 denote the undersurfaces.

As seen from the above, the areas inside and outside of the first slits 20A and 20B that surround the bonding windows 11A and 11C are connected by the first connecting areas 30 and 31 formed by the second slits 21A, 21B and 22A, 22B, and by the second connecting areas 32 and 33 formed by the third slits 25 and 26, which extend in the direction of X axis that is perpendicular to the connecting direction (Y axis direction) of the first connecting areas 30 and 31. Accordingly, the thermal expansion in the direction of Y axis inside the first slits 20A and 20B is absorbed by the X axis portions of the second slits 21A, 21B and 22A, 22B and by the third slits 25 and 26 which are perpendicular to the Y axis orientation of the first connecting areas 30 and 31. Furthermore, with the first slits 20A and 20B, the X-axis direction of the retainer 10 is in a state of free with respect to the thermal expansion.

Since the thermal expansion in the direction of Y axis inside the first slits 20A and 20B is absorbed, the workpiece retaining portions 12A, 13A, 12B, 13B, 12C and 13C can securely retain the leads 5 of the bonding portions 2A, 2B and 2C of the lead 1 throughout the entire retention range that is required to be retained.

Figure 4:
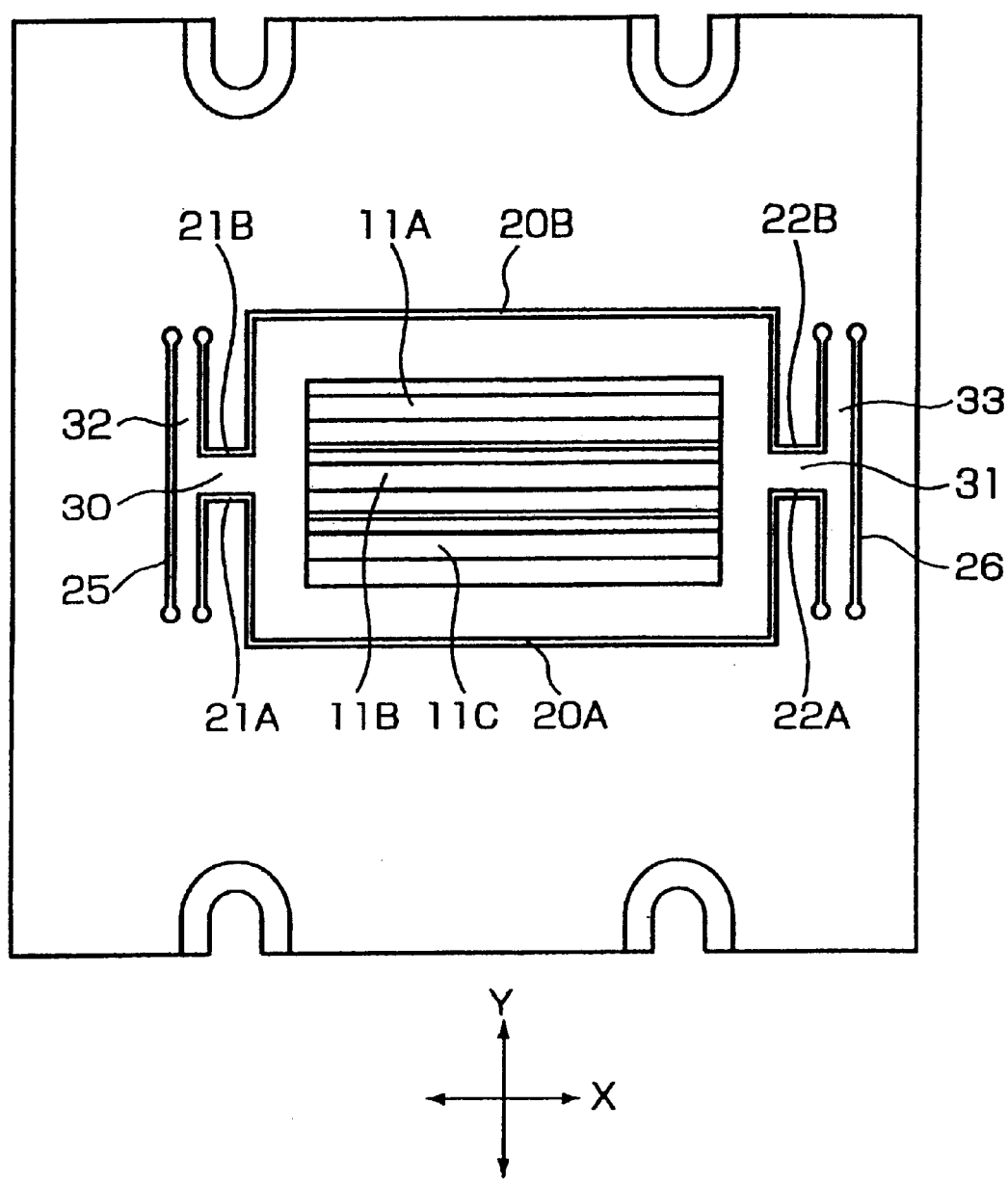
FIG. 4 is a top view of the workpiece retainer according to another embodiment of present invention.

FIG. 4 shows another embodiment of the retainer of the present invention.

In this embodiment, the first slits 20A and 20B, second slits 21A, 22A and 21B, 22B and third slits 25 and 26 in the embodiment of FIG. 1 are rotated 90 degrees. Accordingly, in this embodiment of FIG. 4, the areas inside and outside the two first slits 20A and 20B that surround the bonding windows 11A, 11B and 11C are connected (or continuous) by the first connecting areas 30 and 31 formed by the second slits 21A, 21B and 22A, 22B, and by the second connecting areas 32 and 33 formed by the third slits 25 and 26 which extend in the direction of Y axis that is perpendicular to the connecting direction (X axis direction) of the first connecting areas 30 and 31.

Accordingly, the thermal expansion in the direction of X axis inside the first slits 20A and 20B is absorbed by the Y axis portions of the second slits 21A, 2113 and 22A, 22B and by the third slits 25 and 26 which are perpendicular to the X axis orientation of the first connecting areas 30 and 31. Furthermore, with the first slits 20A and 20B, the Y-axis direction of the retainer 10 is in a state of free with respect to the thermal expansion. Moreover, since the thermal expansion in the direction of the X axis inside the first slits 20A and 20B is absorbed, the workpiece retaining portions 12A, 13A, 12B, 13B, 12C and 13C can securely retain the leads 5 of the bonding portions 2A, 2B and 2C of the lead 1 throughout the entire retention range.

In the embodiment shown in FIG. 1, the connecting areas 30 and 31 are formed so as to extend in the direction of Y axis of the workpiece retainer 10; and in the embodiment shown in FIG. 4, the connecting areas 30 and 31 are formed so as to extend in the direction of X axis of the workpiece retainer 10. However, it is also possible to combine the arrangements of FIGS. 1 and 4, so that the connecting areas 30 through 33 are formed so as to extend in the direction of Y-axis and in the direction of X-axis.

Furthermore, respective bonding windows 11A, 11B and 11C are opened so as to correspond to the three rows of the bonding portions 2A, 2B and 2C in the conveying direction of the lead frame 1. However, the present invention is not limited to three bonding windows 11A, 11B and 11C. For example, only one bonding window can be formed in the retainer. Nonetheless, by way of forming the bonding windows 11A, 11B and 11C so as to correspond in number to the bonding portions 2A, 2B and 2C as in this shown embodiments, the thermal expansion of the respective workpiece retaining portions 12A, 13A, 12B, 13B, 12C and 13C can be assuredly absorbed, and both sides of the bonding portions 2A, 2B and 2C are securely retained.

As seen from the above, in the retainer of the present invention, a plurality of first slits are formed so as to surround the bonding window of the retainer, first connecting areas are formed by second slits that respectively extend to the outside from the end portions of the first slits, and second connecting areas are formed perpendicular to the first connecting areas by forming third slits on the outside of the second slits. Accordingly, the thermal expansion of the workpiece retaining portions of the workpiece retainer is effectively absorbed, and the leads of the lead frame can be securely retained throughout the entire retention ranges.

What is claimed is:

1. A workpiece retainer used in a bonding apparatus, comprising:

a plurality of first slits formed so as to surround bonding windows opened in said workpiece retainer;

second slits formed so as to respectively extend to outside from end portions of said first slits, thus forming first connecting areas; and third slits formed on outside of said second slits so as to be perpendicular to said first connecting areas, thus forming second connecting areas.

2. The workpiece retainer according to claim 1, wherein:

said bonding windows are provided in a plural number that corresponds to bonding portions of a lead frame that has a plurality of rows of bonding portions, and workpiece retaining portions are formed along said plurality of bonding windows on undersurfaces of both sides of each one of said bonding windows.

* * * * *